(12) United States Patent
Okubora et al.

(10) Patent No.: US 6,528,732 B1
(45) Date of Patent: Mar. 4, 2003

(54) CIRCUIT DEVICE BOARD, SEMICONDUCTOR COMPONENT, AND METHOD OF MAKING THE SAME

(75) Inventors: Akihiko Okubora, Kanagawa (JP); Takayuki Hirabayashi, Tokyo (JP); Hideyuki Shikichi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/642,498

(22) Filed: Aug. 18, 2000

(30) Foreign Application Priority Data

Aug. 19, 1999 (JP) .............................. 11-233257

(51) Int. Cl.⁷ .................... H05K 1/14; H05K 3/36; H01P 1/203
(52) U.S. Cl. ................ 174/255; 174/259; 361/780; 361/794; 333/185; 333/204; 333/246; 333/247; 29/830
(58) Field of Search .................. 361/780, 792–795; 333/185, 246, 247, 204, 219, 219.1, 236, 238; 257/728; 29/830, 831, 846; 438/977; 174/255, 259, 260

(56) References Cited

U.S. PATENT DOCUMENTS

| | | | | |
|---|---|---|---|---|
| 3,795,047 A | * | 3/1974 | Abolafia et al. ............. 29/830 |
| 4,916,417 A | * | 4/1990 | Ishikawa et al. ............. 333/204 |
| 5,164,692 A | * | 11/1992 | Gertel et al. ................ 333/246 |
| 5,359,488 A | * | 10/1994 | Leahy et al. ................ 361/792 |
| 5,525,942 A | * | 6/1996 | Horii et al. ................. 333/204 |
| 5,851,845 A | * | 12/1998 | Wood et al. ................ 438/977 |
| 6,177,850 B1 | * | 1/2001 | Furutani et al. ............ 333/185 |
| 6,258,449 B1 | * | 7/2001 | Nagasawa et al. ........... 174/260 |
| 2002/0059723 A1 | * | 5/2002 | Kresge et al. ................ 29/846 |

* cited by examiner

Primary Examiner—Albert W. Paladini
Assistant Examiner—John B. Vigushin
(74) Attorney, Agent, or Firm—Sonnenschein, Nath & Rosenthal

(57) ABSTRACT

A circuit device board having a desired characteristic is provided by bonding dielectric substrates.

A printed board 11 carrying patterns 11a and 11b incorporating a resonator is joined by a prepreg 13 to a printed board 12 carrying patterns 12a and 12b, which are substantially identical to the patterns 11a and 11b, so that the patterns come opposite to each other. As a grounding conductor is provided on the outer side of each of the printed boards 11 and 12, a band-pass filter having the three-plate structure is completed. The patterns 11a and 12a are connected to each other for determining the signal input while the patterns 11b and 12b are connected to each other for determining the signal output. Accordingly, the frequency response can be obtained at a desired level regardless of the thickness of the prepreg 13.

20 Claims, 18 Drawing Sheets fo: CENTER FREQUENCY
WT: TRANSMISSIVE BANDWIDTH

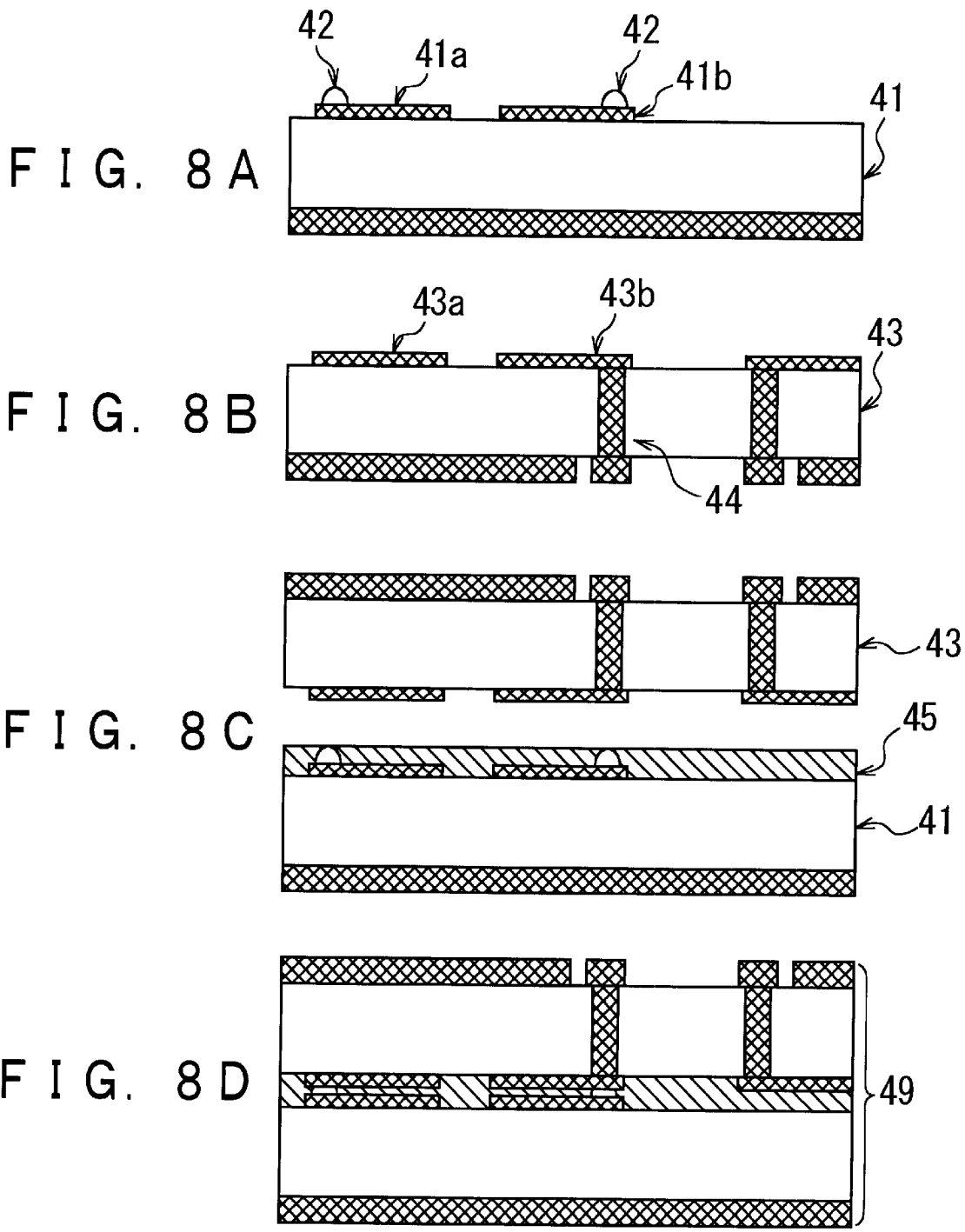

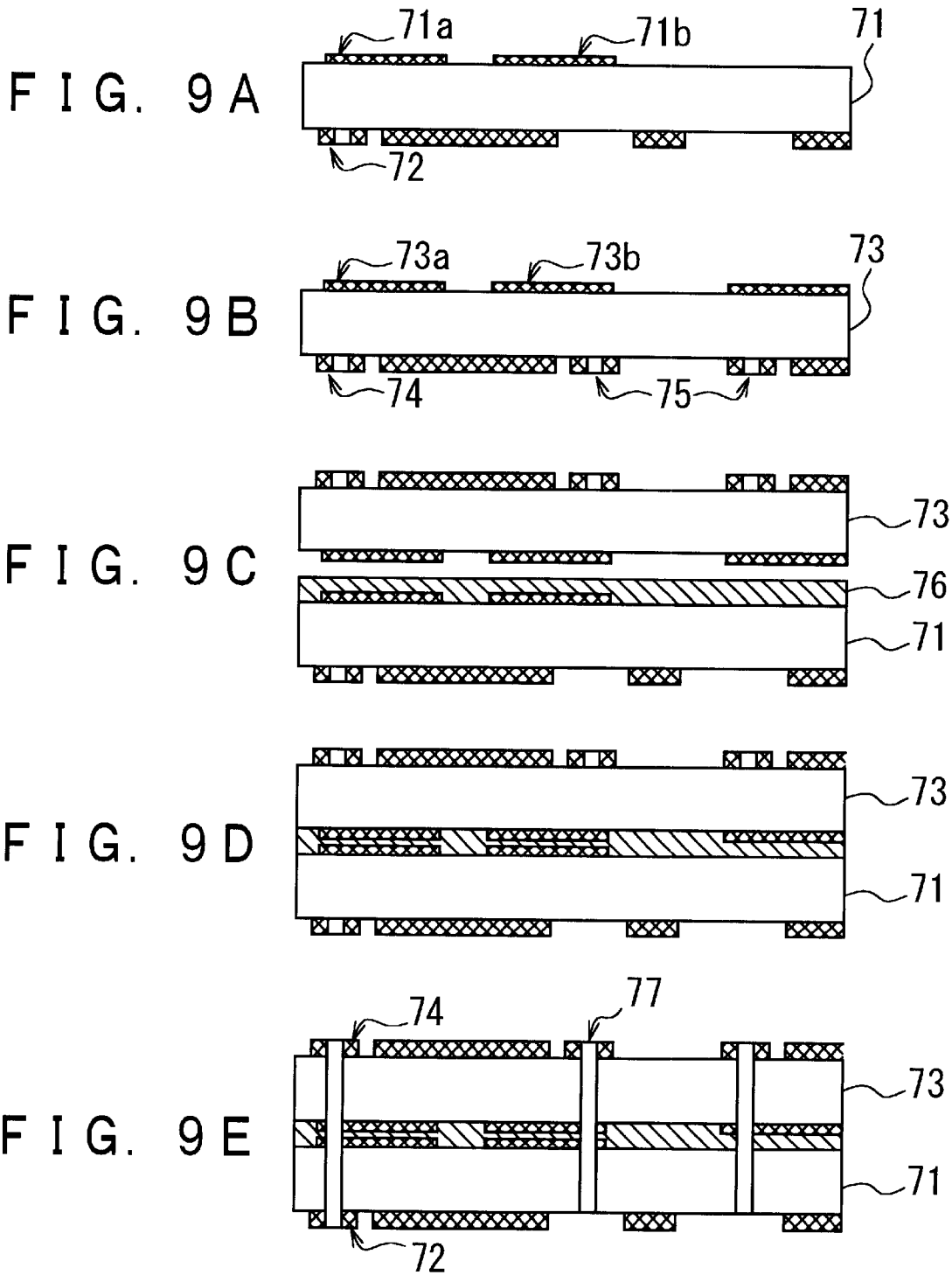

F I G. 1 4
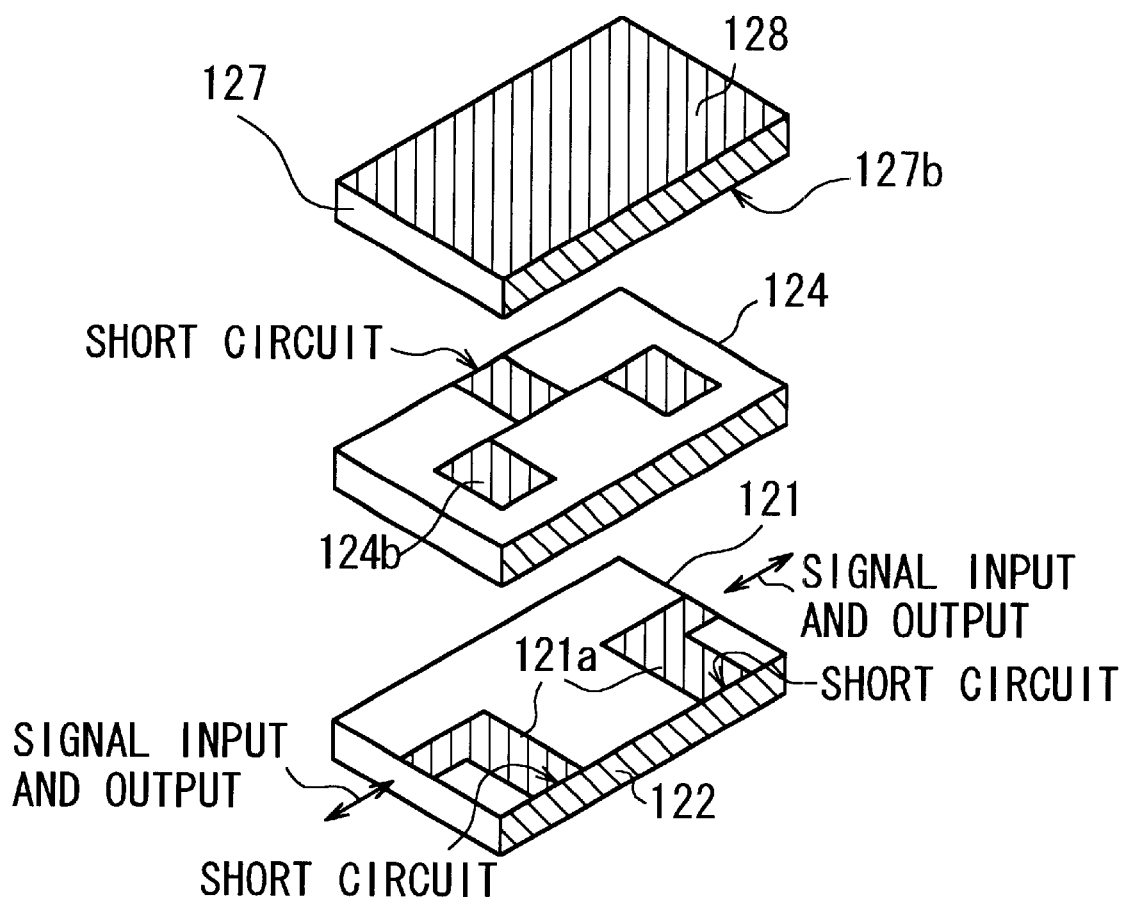

CIRCUIT DEVICE BOARD, SEMICONDUCTOR COMPONENT, AND METHOD OF MAKING THE SAME

BACKGROUND OF THE INVENTION

1. Field of the Invention

The present invention relates to a circuit device board, a semiconductor component, and a method of fabricating the same. More specifically, the circuit device board is fabricated by: forming a first conductor pattern, which determines the function of the circuit device, on one side of a first dielectric substrate having two conductive layers provided on both sides thereof respectively; forming a second conductor pattern, which is substantially identical in the shape to the first conductor pattern when the two patterns are placed one over the other, on one side of a second dielectric substrate having two conductive layers provided on both sides thereof respectively; and bonding the first dielectric substrate and the second dielectric substrate to each other by an adhesive dielectric layer so that the first conductor pattern and the second conductor pattern can overlap each other. Also, while a semiconductor device is connected with the first or second conductor pattern, the first conductor pattern and the second conductor pattern are connected to each other for input and output of signals. Accordingly, a desired level of the frequency response can be obtained regardless of the thickness of the adhesive dielectric layer which joins the two dielectric substrates.

2. Description of the Related Art

For transmission of data at a higher speed over a radio link or a cable line in the sharply developing communications technology, a variety of circuit blocks are installed in relevant apparatuses such as mobile communications instruments, ISDN appliances, or computers.

As equipped with such a circuit block, every arrangement is desired to minimize the effect of noise while conduct the transmission of data at a high speed. It is also essential for portable communications apparatuses to decrease the size of components, have the components integrated, and provide multi-function types of the components. For example, for implementing a functional block in a high-frequency circuit, distributed constant circuits are commonly used for minimizing and integrating filters, high-frequency matching circuits, or coupler circuits, because a VCO (voltage controlled oscillator) or a filter is hardly feasible with the use of semiconductor devices as its wavelength becomes short.

It is known that development at high accuracy of an advanced band-pass filter on a substrate is implemented using a co-planar waveguide or a microstrip which is a planar transmission line with a ¼λ coupling path (λ being a wavelength). However, such a conventional circuitry arrangement is developed on the surface of a substrate and may thus possibly generate interference with other external circuits. The arrangement may also emit electromagnetic waves causing malfunction of adjacent devices. It is hence necessary for minimizing the effect of electromagnetic waves to shield the entire arrangement or to protect with an electromagnetic waves absorbing material. This will make the arrangement very intricate and increase the overall dimensions, resulting in the cost up. Moreover, the circuitry arrangement is normally developed along a plane and will thus be increased in the size when the frequency is within a relatively lower range.

The circuitry arrangement such as a band-pass filter is modified to have a combination of the step impedance resonance structure and the strip line structure where the signal lines are sandwiched between two grounding conductors for minimizing the effect of electromagnetic waves, whereby its side can be decreased by minimizing the resonator.

FIG. 1 illustrates such a band-pass filter having the step impedance resonance structure, where two dielectric substrates 202 are installed between external grounding conductors 201 while a resonator 203 comprising a couple of signal conductive layers which are different in the impedance is sandwiched between the two dielectric substrates 202. The frequency response of the band-pass filter of FIG. 1 is graphed in FIG. 2 where f0 is a center frequency and WT is a transmissive band width.

A circuit device board incorporating the band-pass filter shown in FIG. 1 is declined in the frequency response if there are generated variations in the thickness of dielectric substrates or in the accuracy of fabricating conductor patterns which determine the function of a circuit device. FIG. 3 illustrates the relation in change between the dielectric substrate thickness and the center frequency. For example, when the dielectric substrate thickness is varied 5%, the center frequency may change substantially 1% to 2%. With 5 GHz of the center frequency of the band-pass filter, the frequency will change up to 100 MHz at maximum and hardly be feasible. For eliminating undesired variations in the frequency response, it is needed to fabricate the substrates and the patterns at a considerable level of accuracy and the band-pass filter will thus be costly.

To decrease the cost of front-end devices of a specific communications apparatus using microwaves or milliwaves, the substrates are formed of organic materials such as fiber glass based epoxy resin or fiber glass based BT bismaleimide-triazine) resin instead of traditional ceramic materials. Such organic substrates are however different and more difficult in the fabrication than the traditional ceramic substrates. Particularly, a layer arrangement of the band-pass filter where a plurality of organic substrates are placed one over another possibly finds difficult in controlling the thickness of an adhesive layer which is a part of the dielectric film and its filtering characteristic will hardly stay at a desired level.

FIGS. 4A and 4B each shows an arrangement including the dielectric substrates made of an organic material. FIG. 4A is an exploded perspective view and FIG. 4B is a schematic cross sectional view taken along the line denoted by PA of FIG. 4A. Referring to FIG. 4A, the arrangement or a band-pass filter employs the two organic substrates 210 and 215. The organic substrate 210 is a double-side printed circuit board of which the joining side (located opposite to the other dielectric substrate 215) has conductor patterns 210a and 210b of a resonance circuit provided thereon. A shield coating 210c is provided on the other side of the organic substrate 210. The other organic substrate 215 is a single-side printed circuit board of which the conductive side is covered with a shield coating 215c.

As the conductor pattern 210a side of the double-side printed circuit-board 210 comes opposite to the other side of the single-side printed circuit board 215 where the shield coating 215c is not provided, a prepreg 218 for bonding is sandwiched between the double-side printed circuit board 210 and the single-side printed circuit board 215. After pressing and heating the assembly, a step impedance resonance arrangement of the band-pass filter is completed.

The thickness of the double-side printed circuit board 210 or the single-side printed circuit board 215 can easily be controlled at high precision. However, the thickness of the prepreg 218 which is an adhesive dielectric layer for bonding the substrates may significantly be varied depending on the conditions of fabrication and the patterning rate of the printed circuit board and hardly be adjusted to a desired setting.

If the thickness of the prepreg 218 varies, a desired level of the filtering characteristic can rarely be obtained. As the yield of the band-pass filter is declined, the band-pass filter will be high in the cost even when its substrate materials are inexpensive.

SUMMARY OF THE INVENTION

It is thus an object of the present invention to provide a circuit device board, a semiconductor component, and a method of the same, of which the characteristic has a desired level with two or more dielectric substrates joined one another.

A circuit device board according to the present invention is provided by: joining a first dielectric substrate having a first conductor pattern provided thereon to a second dielectric substrate having a second conductor pattern provided thereon by an adhesive dielectric layer so that the two conductor patterns come opposite to each other; arranging the first conductor pattern to a circuit device pattern shape for performing a desired function while arranging the second conductor pattern to a shape substantially identical to the first conductor pattern so that the two patterns can overlap each other; and providing a grounding conductor on the outer side of each of the first and second dielectric substrates.

A method of making a circuit device board according to the present invention is provided comprising the steps of: forming a first conductor pattern, which determines the function of the circuit device, on one side of a first dielectric substrate having two conductive layers provided on both sides thereof respectively; forming a second conductor pattern, which is substantially identical in the shape to the first conductor pattern when the two patterns are placed one over the other, on one side of a second dielectric substrate having two conductive layers provided on both sides thereof respectively; and bonding the first dielectric substrate and the second dielectric substrate to each other by an adhesive dielectric layer so that the first conductor pattern and the second conductor pattern can overlap each other.

A semiconductor component according to the present invention is provided by: bonding a first dielectric substrate having a first conductor pattern provided thereon to a second dielectric substrate having a second conductor pattern provided thereon by an adhesive dielectric layer so that the two conductor patterns come opposite to each other; arranging the first conductor pattern to a circuit device pattern shape for performing a desired function while arranging the second conductor pattern to a shape substantially identical to the first conductor pattern so that the two patterns can overlap each other; connecting the first conductor pattern and the second conductor pattern to each other by connecting members; and providing a semiconductor device connected to at least one of the first and second conductor patterns.

A method of making a semiconductor component according to the present invention is provided comprising the steps of: forming a first conductor pattern, which determines the function of a circuit device, on one side of a first dielectric substrate having two conductive layers provided on both sides thereof respectively; forming a second conductor pattern, which is substantially identical in the shape to the first conductor pattern when the two patterns are placed one over the other, on one side of a second dielectric substrate having two conductive layers provided on both sides thereof respectively; and bonding the first dielectric substrate and the second dielectric substrate to each other by an adhesive dielectric layer so that the first conductor pattern and the second conductor pattern can overlap each other, thus connecting the first conductor pattern and the second conductor pattern to each other and the semiconductor device to at least one of the first and second conductor patterns.

Accordingly, when a band-pass filter is developed as the circuit device on one side of a double-side copper laminated board which is the first dielectric substrate having the two conductor layers provided on both sides thereof, the first conductive pattern incorporates a resonator pattern. Also, a resonator pattern which is substantially identical in the shape to the resonator pattern of the first double-side copper laminated board is provided on one side of a second double-side copper laminated board or the second dielectric substrate so that the two patterns is located one over the other. The first and second double-side copper laminated boards are bonded to each other by the adhesive dielectric layer so that their resonator patterns come opposite to each other. Alternatively, a plurality of substantially equally shaped resonator patterns including those of the first and second double-side copper laminated boards may be provided one over another with any two adjacent patterns isolated by an insulating dielectric layer. In addition, the resonator pattern of the first double-side copper laminated board may be joined to the resonator pattern of the second double-side copper laminated board by projected electrodes. The resonator pattern of the first or second double-side copper laminated board may be connected with the semiconductor device such as an MMIC. The semiconductor device may be mounted to outer side of the assembly of the first and second double-side copper laminated boards which are joined to each other by via holes or through holes connected between the resonator patterns. Alternatively, after the resonator pattern of the first or second double-side copper laminated board is connected by bumps with the semiconductor device such as an MMIC, the first double-side copper laminated board and the second double-side copper laminated board are bonded to each other so that the semiconductor device is sandwiched therebetween.

BRIEF DESCRIPTION OF THE DRAWINGS

FIGS. 8A to 8F are views showing a method of fabricating the semiconductor component.

FIGS. 9A to 9G are views showing another method of fabricating the semiconductor component;

FIG. 14 is a view showing a high-pass filter.

DESCRIPTION OF THE PREFERRED EMBODIMENT

Figure 1:
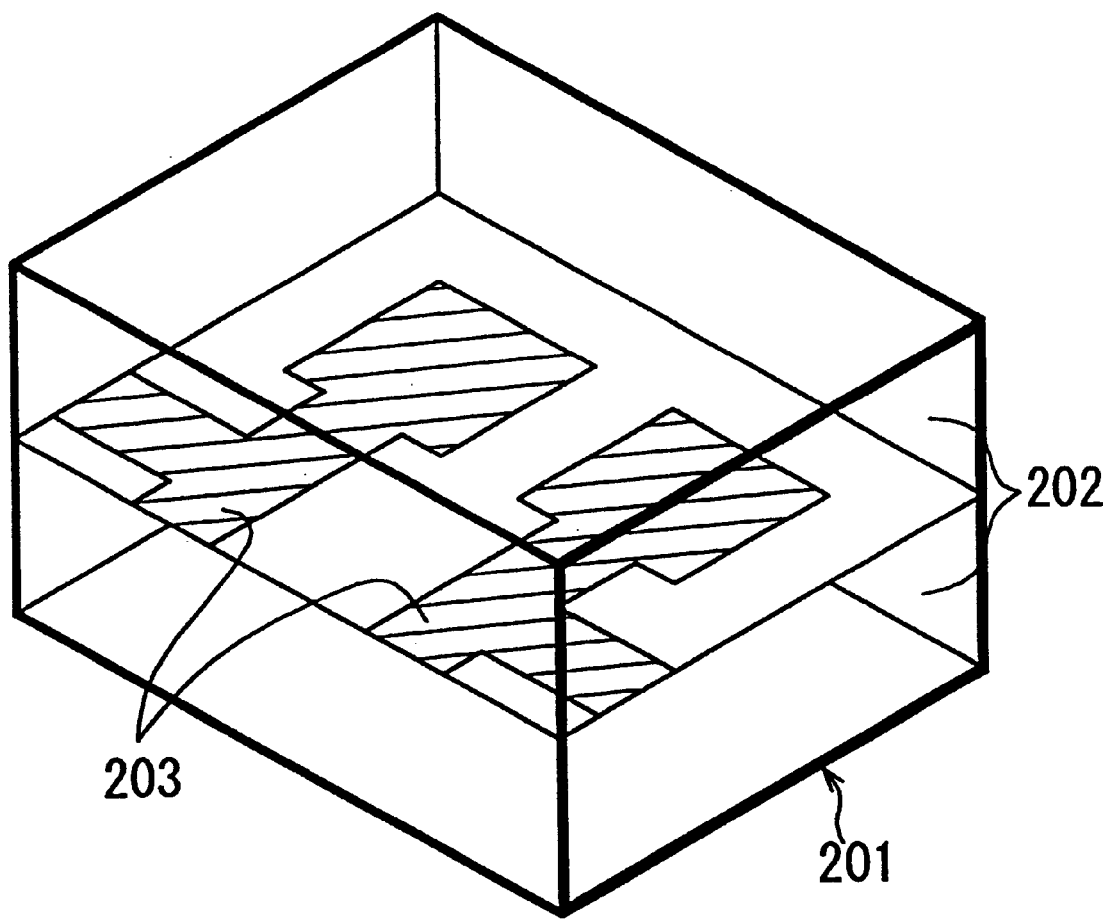
FIG. 1 is a view showing a band-pass filter.
Figure 2:
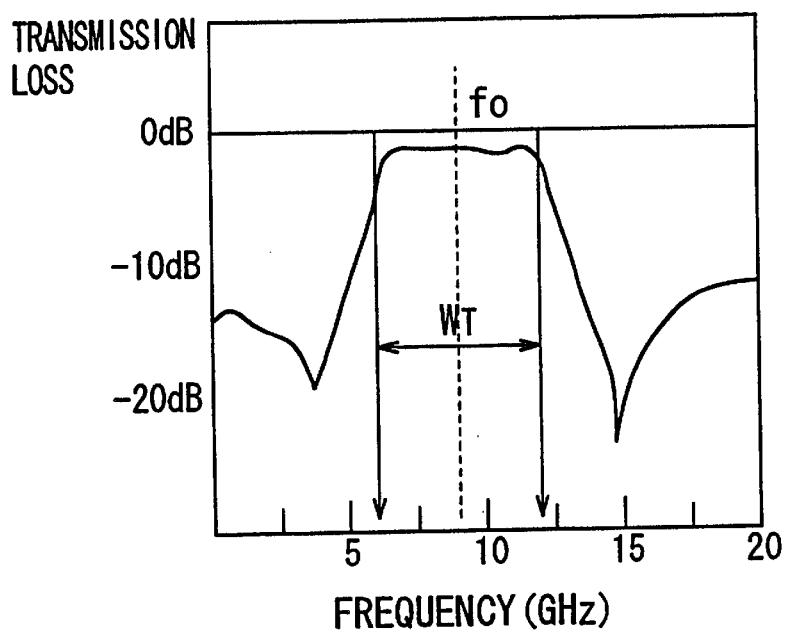
FIG. 2 is a diagram showing a frequency response of the band-pass filter.
Figure 3:
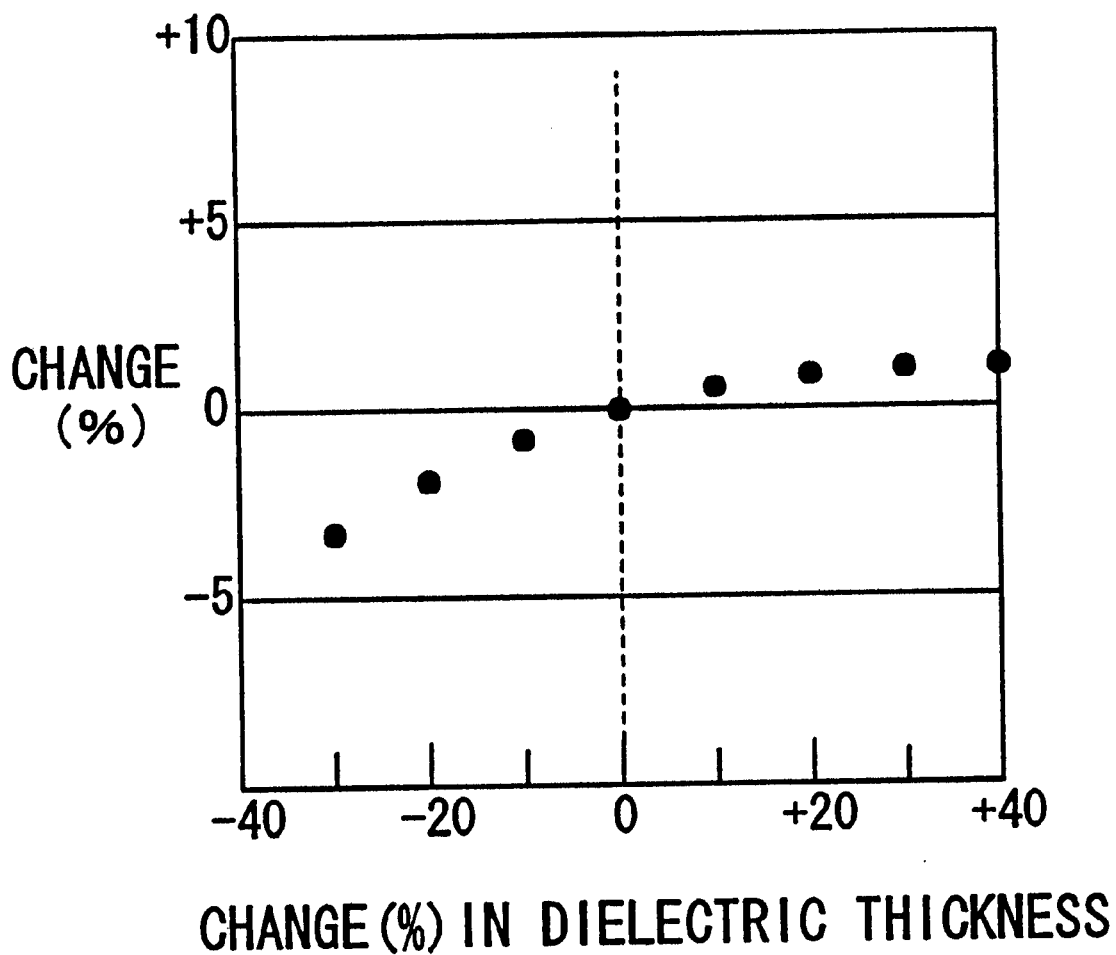
FIG. 3 is a diagram showing the relation in change between the dielectric layer thickness and the center frequency.
Figure 4A:
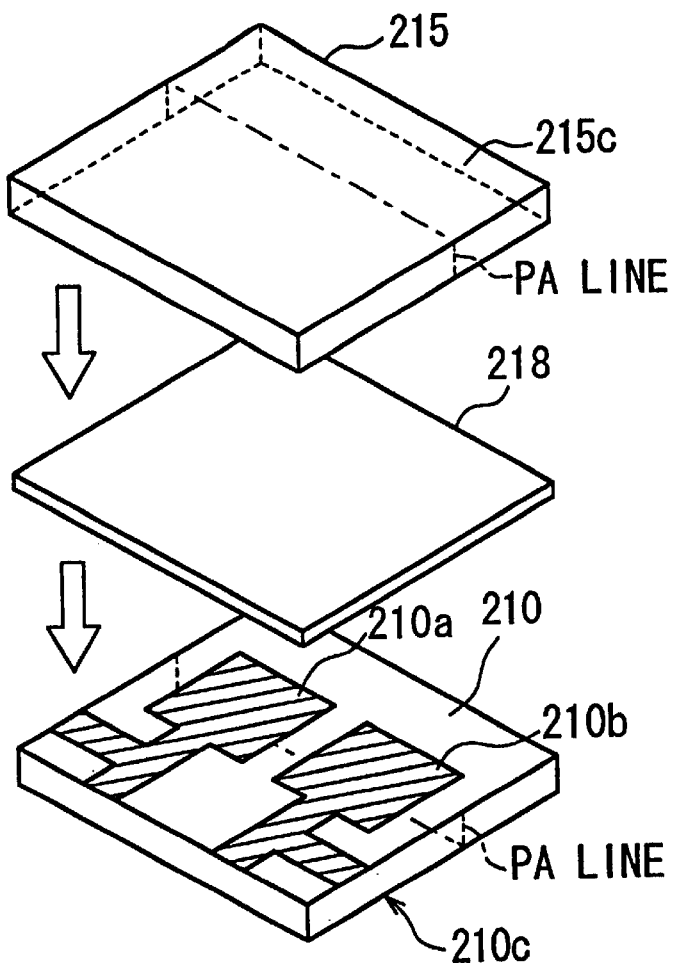
FIGS. 4A and 4B are views showing a conventional band-pass filter employing organic substrates.
Figure 4B:
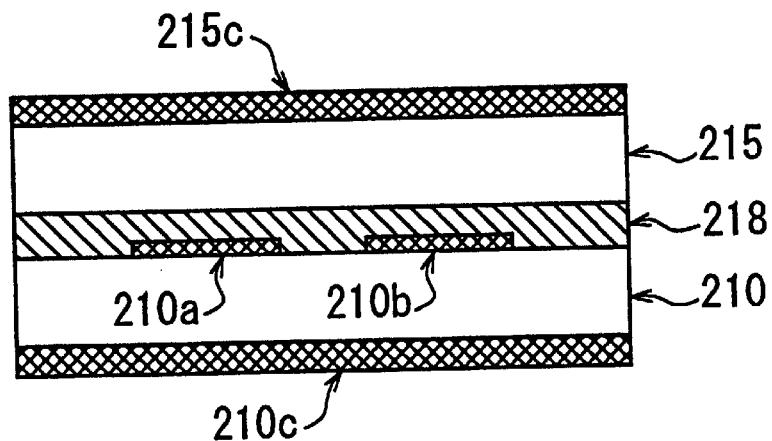
Figure 5A:
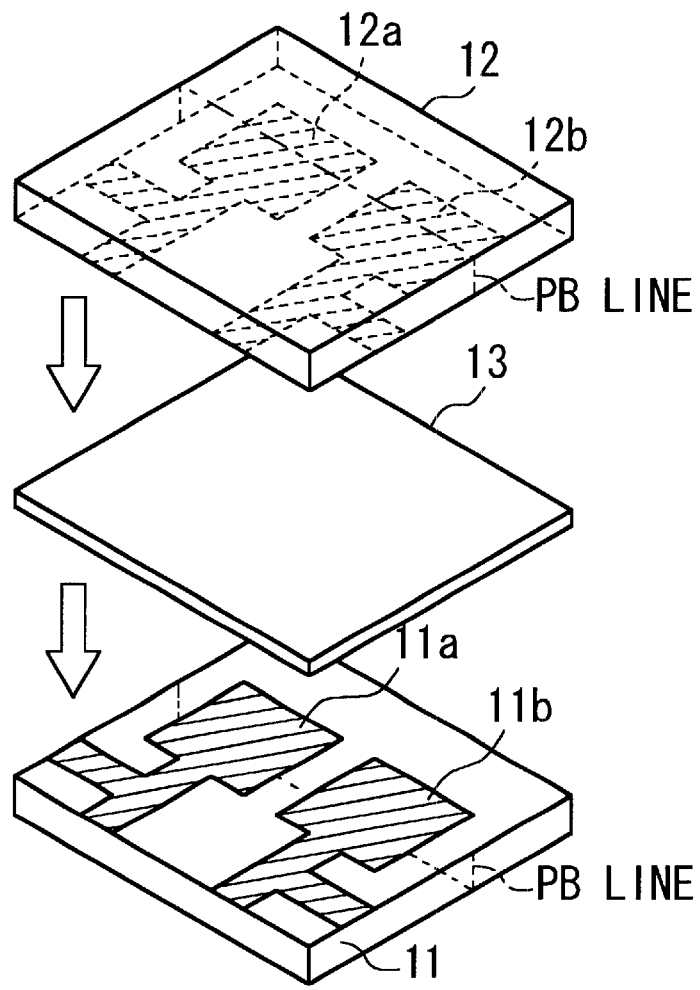
FIGS. 5A and 5B are views showing the band-filter
Figure 5B:
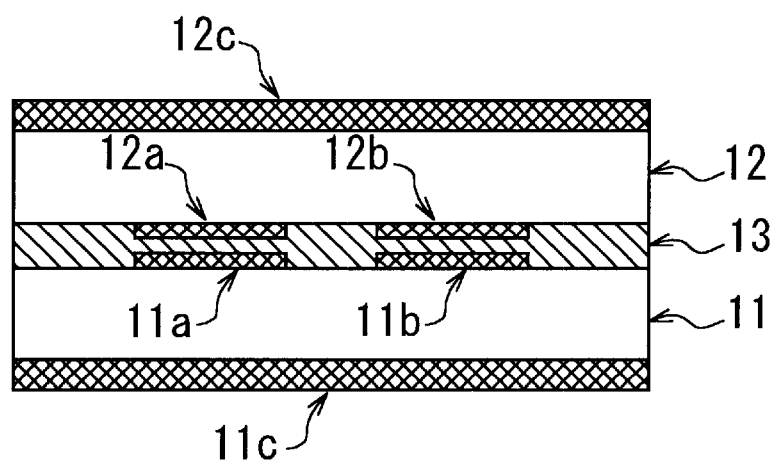

One embodiment of the present invention will be described in more detail referring to the drawings. FIGS. 5A and 5B each illustrates a basic structure of the present invention which comprises two dielectric substrates 11 and 12 forming a circuit device board, namely a band-pass filter having a step impedance resonance (SIR) structure. The two dielectric substrates 11 and 12 may be implemented of a dielectric base having a conductive layer provided on each side thereof (referred to as a double-side printed circuit board hereinafter). For example, the double-side printed circuit board as a double-side copper patterned board has a couple of conductive patterns 11a and 11b or 12a and 12b, which incorporate a resonator, (referred to simply as patterns hereinafter) provided on one side thereof. As the patterns 11a and 11b on the double-side printed circuit board 11 are placed over the patterns 12a and 12b of the double-side printed circuit board 12, the opposite patterns 11a and 12a come opposite to each other while the other opposite patterns 11b and 12b come opposite to each other, as shown in FIG. 5A.

A prepreg 13 for joining is then sandwiched between the two double-side printed circuit boards 11 and 12 with the opposite patterns 11a and 12a situated opposite to each other and the other opposite patterns 11b and 12b situated opposite to each other. When pressed and heated, the two double-side printed circuit boards 11 and 12 are joined to each other. Then, the opposite patterns 11a and 12a are bonded to each other while the other opposite patterns 11b and 12b are bonded to each other. The other sides of the double-side printed circuit boards 11 and 12 where no patterns are provided are covered with shield coatings 11c and 12c respectively. As a result, a circuit device board acting as a band-pass filter of the SIR structure is completed having a desired level of filtering characteristic regardless of the thickness of the prepreg 13. FIG. 5B is a schematic cross sectional view taken along the one-dot chain line denoted at PB of FIG. 5A.

FIGS. 6A to 6D each illustrates a method of fabricating a circuit device board device having the arrangement shown in FIGS. 5A and 5B. Two double-side printed circuit boards 21 and 22 prepared as the dielectric substrates are selected from, for example, glass fiber substrates impregnated with an epoxy resin (equivalent to a type FR-4 of the National Electrical Manufacturers Association in U.S.A.), with a specific epoxy resin having a higher level of glass transition temperature Tg, such as a type FR-5, and with other resins with are low in the dielectric constant ($\epsilon < 4$) and the dielectric dissipation factor ($\delta < 0.01$), including BT (bismaleimide-triazine) resins, PPE (polyphenylene-ether), Teflon, and polyimide, hence improving the high-frequency response. Other substrates may also be used wherein the material of the substrates is not limited to glass fibers but any other organic polymers such as polyimide, acrylate, or polyolefin may equally be employed. Furthermore, ceramic substrates such as alumina, mullite, or glass ceramic as well as organic-ceramic composite substrates may be used.

Figure 6A:
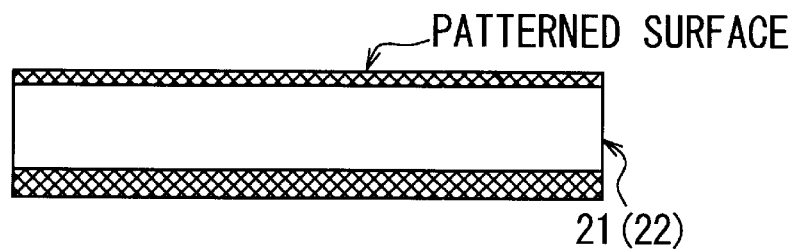
FIGS. 6A to 6D are views showing a method of fabricating the band-pass filter.
Figure 6B:
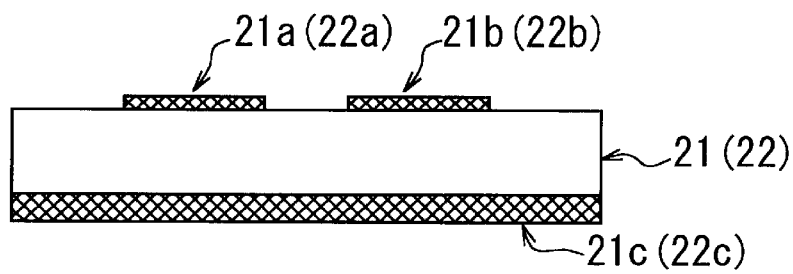
Figure 6C:
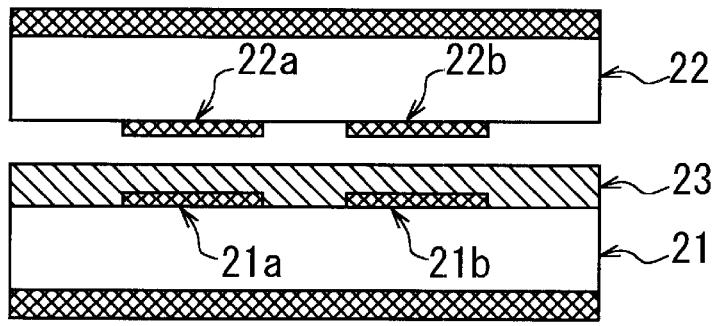

For elaborating patterns 21a, 21b, 22a, and 22b on the double-side printed circuit boards 21 and 22, the unwanted regions of copper foil are removed by etching. The copper foil shaped to a desired pattern is preferably as thin as possible for increasing the patterning accuracy. Also, because the frequency of a signal to be band rejected by a filter is high, its current flows along a surface of the copper foil due to the skin effect. Accordingly, even if the copper foil is thin, the filter can be maintained at a desired level of the filtering characteristic. As shown in FIG. 6A, the thickness of the copper foil which is commonly 18 $\mu$m may be 12 $\mu$m, preferably 9 $\mu$m, and more preferably 5 $\mu$m. On the contrary, the copper foil on the other side where no patterns are provided or no precision patterning is involved serves as the shield coating and its thickness may preferably be greater than that of the patterned copper foil. The patterns 21a, 21b, 22a, 22b, are formed as shown in FIG. 6B, the double-side printed circuit boards 21 and 22 are then covered at one side with the patterns 21a, 21b, and 22a, 22b of the copper foil respectively forming signal paths with high accuracy. It is elaborately patterned so that the patterns 21a and 22a are placed one over the other while the patterns 21b and 22b are placed one over the other. This is followed by applying an adhesive film or a laminator 23 (acting as the prepreg) on the patterned side of one of the double-side printed circuit boards, for example, 21 as shown in FIG. 6C.

Figure 6D:
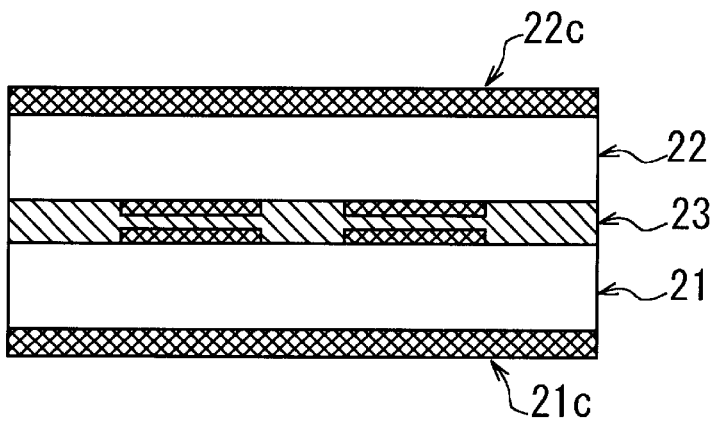

The two double-side printed circuit boards 21 and 22 are then positioned so that the patterns 21a and 21b come opposite to the patterns 22a and 22b respectively, placed one over the other as shown in FIG. 6D, and pressed against each other, hence bonding the pattern 21a to the pattern 22a and the pattern 21b to the pattern 22b. The double-side printed circuit boards 21 and 22 are then covered with two shield coatings 21c and 22c respectively. As a result, a circuit device board serving as the band-pass filter shown in FIGS. 5A and 5B are completed.

Although the two double-side printed circuit boards 21 and 22 are joined to each other by the adhesive film 23 in the first method, they may be bonded to each other by an adhesive agent. The adhesive agent can be selected from epoxy resins, polyimide resins, acrylic resins, and rubber resins.

The adhesive agent may be applied by a printing method, a curtain coating method of preparing a thin curtain of the adhesive and running the substrate beneath the curtain, a spin coating method of dropping the adhesive over the substrate spinning and spreading it by the effect of centrifugal force, or a meniscus coating method of spreading a flow of the adhesive over the substrate by the effect of surface tension to a degree not dropping off from the edge. The two substrate coated with the adhesive agent by such a method are then pressed against each other and heated for thermosetting. As a result, a circuit device board device serving as the band-pass filter shown in FIGS. 5A and 5B are completed.

According to the first method, the two double-side printed circuit board 21 and 22 are joined to each other to yield a band-pass filter having the SIR structure. The filter may also be formed of a multi-layer structure of the signal paths as stripped transmission lines.

Figure 7A:
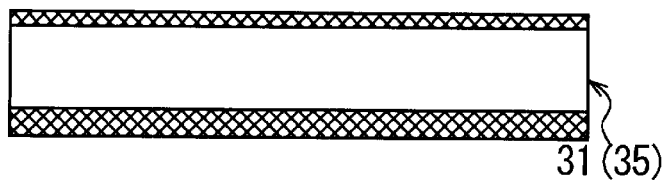
FIGS. 7A to 7G are views showing a method of fabricating a band-pass filter in which the patterns are provided in layers.
Figure 7B:
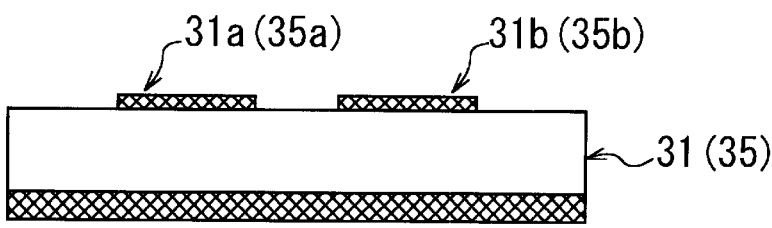
Figure 7C:
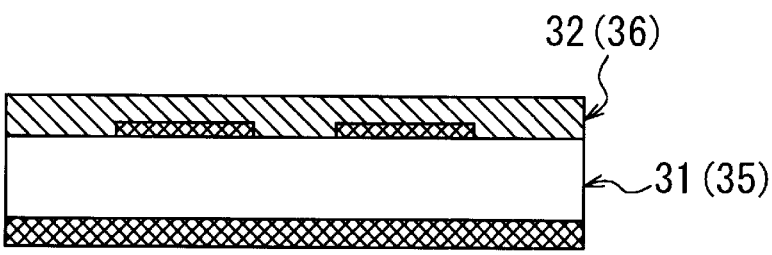
Figure 7D:
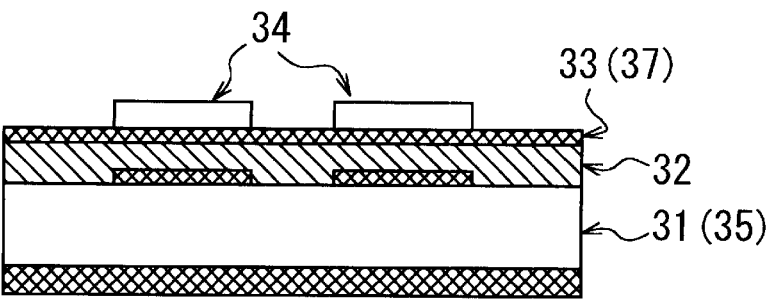
Figure 7E:
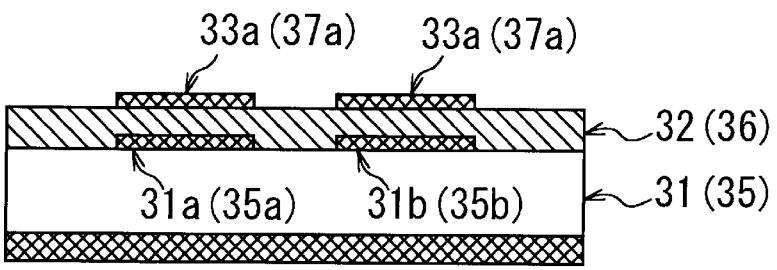

FIGS. 7A to 7G each illustrates an alternative method where the patterns are developed in layers. As shown in FIG. 7B, resonator patterns 31a and 31b are shaped by the same manner as of the first method on the thin copper layer of a double-side printed circuit board 31 shown in FIG. 7A. Then, as shown in FIG. 7C, an insulating dielectric material 32 such as an epoxy resin is applied over by a printing method or a curtain coating method. The insulating dielectric material 32 is cured by heating in a reflow furnace, flattened by e.g. surface polishing, and coated over its flattened surface with a copper foil layer 33 by e.g. non-electrolyte plating as shown in FIG. 7D. The copper foil layer 33 is covered with a resist 34 which is then exposed to have patterns identical to the patterns 31a and 31b. The remaining of the resist 34 is removed by etching. As a result, the patterns 33a and 33b identical to the lower patterns 31a and 31b are yielded on the insulating dielectric material 32 as shown in FIG. 7E.

Similarly, two layers of patterns 35a, 35b and 37a, 37b are yielded on the thin copper layer of another double-side printed circuit board 35 by the same manner as shown in FIGS. 7A to 7E. When the two double-side printed circuit boards 31 and 35 are placed one over the other, the patterns 31a, 33a, 35a, and 37a overlap one another while the patterns 31b, 33b, 35b, and 37b overlap one another.

Figure 7F:
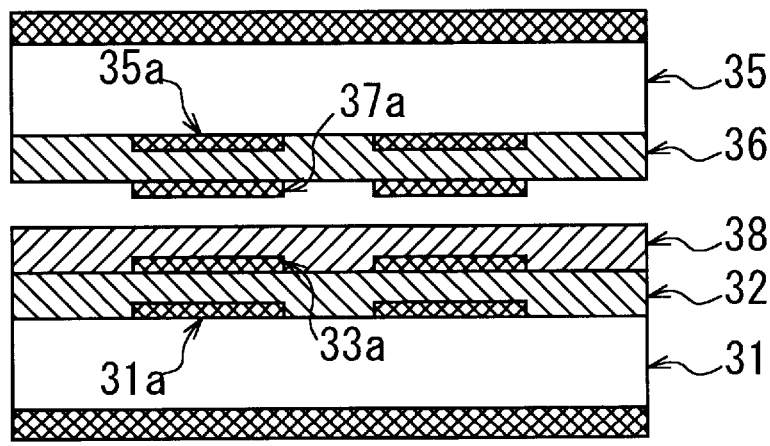
Figure 7G:
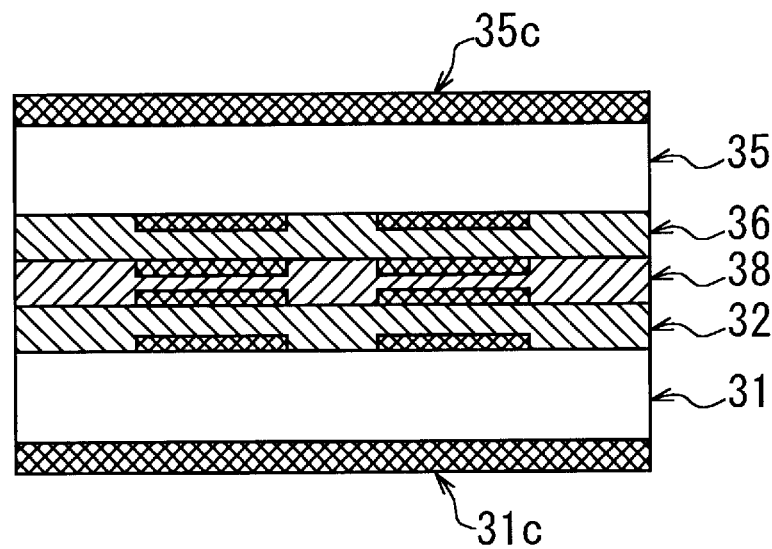

An adhesive film or a laminator 38 (serving as the prepreg) is applied by the same manner as of the first method to the patterned side of one of the two double-side printed circuit boards, for example, 31 as shown in FIG. 7F. As the two double-side printed circuit boards 31 and 35 are joined to each other by the laminator 38, the patterns 31a, 33a, 35a, and 37a are bonded together while the patterns 31b, 33b, 35b, and 37b are bonded together. As a result, a circuit device board of the multi-layer structure acting as the band-pass filter is completed as shown in FIG. 7G.

Since the patterns are yielded in the multi-layer structure, the surface area of the signal paths increases and the skin effect can thus be improved in a high frequency range of signals, thus allowing the band-pass filter to minimize the signal loss.

Although the insulating dielectric materials 32 and 36 are an epoxy resin in the alternative method, they may be any other organic material such as polyimide, acrylate, or BCB (benzo-cyclo-butene). Alternatively, a non-organic dielectric base is formed of silicon dioxide (SiO2) or silicon nitride (SiN) by a thin film process such as a low-temperature CVD method, smoothed on the surface by a CMP (chemical mechanical polishing) method of polishing with abrasives, acids, or alkali solution or an etch-back method of eliminating surface undulations, and provided on the smoothed surface with desired patterns by a lift-off method. More specifically, after a resist is applied over the smoothed surface except the patterns, a metal layer of Cu or Ni/Au or Ti/Pt/Au is coated. The metal layer except the patterns is then removed with the resist. As a result, the patterns of the metal layer are yielded.

The band-pass filter fabricated by the above method is commonly connected to a relevant semiconductor device such as a high-frequency discrete device or an MMIC (monolithic microwave integrated circuit). As the band-pass filter is connected to a semiconductor device, they are desirably mounted together on a circuit device board for minimizing connecting lines in order to avoid signal loss over the extended connecting lines or prevent interference with adjacent circuits.

Figure 8E:
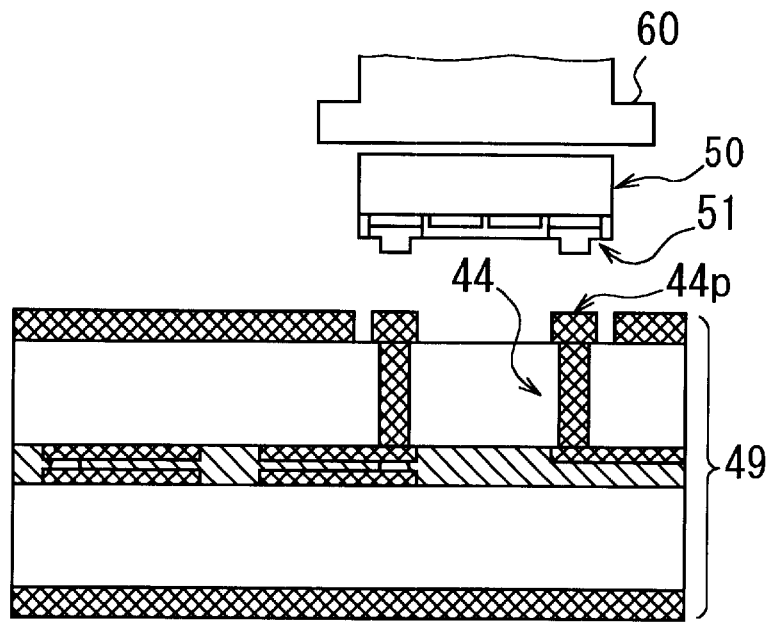

A method of fabricating a semiconductor component having a semiconductor device such as an MMIC flip-chip mounted on a circuit device board will now be described referring to FIGS. 8A to 8F. As shown in FIG. 8A, patterns 41a and 41b incorporating a band-pass filter as well as projected electrodes (bumps) 42 of gold or copper for input and output of signals are provided on a double-side printed circuit board 41. The bumps 42 may be formed by a plating or ball-bonding technique.

Similarly, patterns 43a and 43b incorporating a band-pass filter are provided on another double-side printed circuit board 43 by the same manner as of the double-side printed circuit board 41, as shown in FIG. 8B. Also, via holes 44 are provided at the signal output region of the patterns for output of signals. The via holes 44 are not limited to the signal output region of the patterns but may be located corresponding to bumps 51 on the MMIC 50 for delivering other signals to the MMIC 50 or transferring output signals from the MMIC 50 to a processing circuit.

As the patterns and the via holes have been provided, a coating of adhesive 45 is applied to one of the two double-side printed circuit boards, for example, 41 in this embodiment as shown in FIG. 8C. The double-side printed circuit board 41 coated with the adhesive 45 is then placed over the other double-side printed circuit board 43 so that its patterns 43a and 43b come opposite to patterns on the other board 43.

The two double-side printed circuit boards 41 and 43 are then heated while being pressed against each other, as shown in FIG. 8D, to connect the printed circuit board 41a on the double-side printed circuit board 41 by the bumps 42 to the printed circuit board 43a on the double-side printed circuit board 43. Simultaneously, the printed circuit board 41b on the double-side printed circuit board 41 are connected by the bumps 42 to the printed circuit board 43b on the double-side printed circuit board 43. As the two double-side printed circuit boards 41 and 43 are joined to each other, a circuit device board 49 serving as a band-pass filter is completed.

Figure 8F:
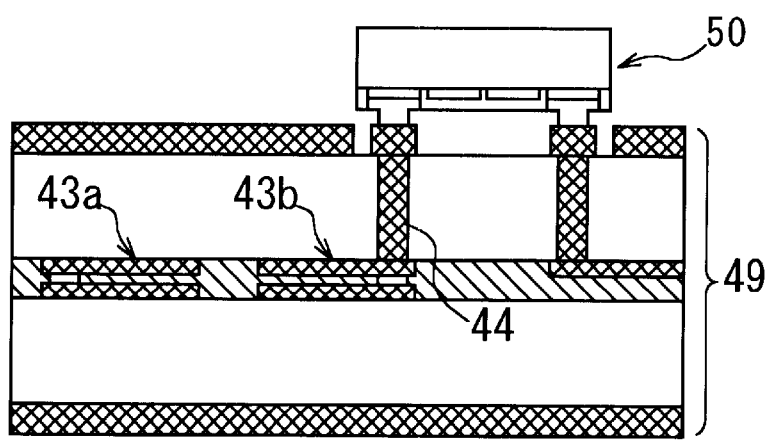

Then, as shown in FIG. 8E, the bumps 51 provided on the MMIC 50 for flip-chip mounting are placed over connecting pads 44p joined to the via hole 44 in the double-side printed circuit board 43. The bumps 51 on the MMIC 50 are heat pressed against and joined to the connecting pads 44p on the double-side printed circuit board 43 by means of a heat pressing head 60. Accordingly, the MMIC 50 is successfully connected by minimum lengths to the patterns incorporating the band-pass filter, as shown in FIG. 8F.

According to the above method of connecting the MMIC 50 by minimum lengths to the patterns incorporating the band-pass filter, the via holes 44 are provided prior to joining the two double-side printed circuit boards to each other. Alternatively, the two boards may first be joined to each other and then provided with through holes which are metal plated at the inner wall to give a level of conductivity or filled with an electrically conductive paste for yielding the via holes to connect between the patterns in layers.

Figure 9F:
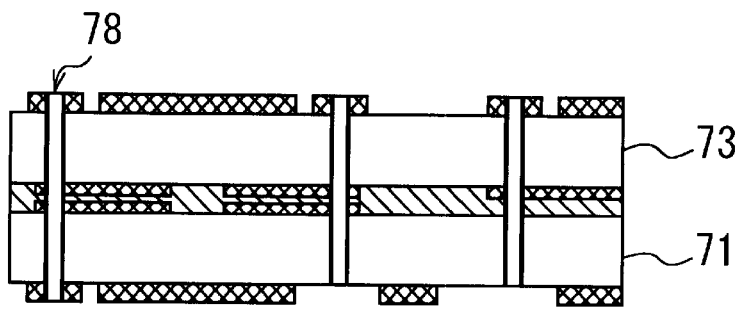

Another method of fabricating the semiconductor component will be explained referring to FIGS. 9A to 9G. As shown in FIG. 9A, patterns 71a and 71b incorporating a band-pass filter are provided on one side of a double-side printed circuit board 71 while lands 72 are provided on the other side to match corresponding through holes. Similarly, as shown in FIG. 9B, patterns 73a and 73b incorporating a band-pass filter are provided on one side of another double-side printed circuit board 73 like the double-side printed circuit board 71 while lands 74 are provided on the other side to match corresponding through holes. In addition, lands 75 are provided on which an MMIC 50 is mounted.

A coating of adhesive 76 is applied to the patterned side of one of the two double-side printed circuit boards 71 and 73, for example, 71 in this embodiment as shown in FIG. 9C. The two double-side printed circuit boards 71 and 73 are positioned one over the other so that the patterns on the double-side printed circuit board 73 come opposite to the patterns on the double-side printed circuit board 71 coated with the adhesive 76. Then, the two double-side printed circuit boards 71 and 73 are heated while being pressed against each other for joining as shown in FIG. 9D.

Through holes 77 are then provided at their corresponding locations by means of drill or laser beam as shown in FIG. 9E. The through holes 77 are then metal plated at the inner wall to have metal films 78 for connecting between the lands and the patterns, as shown in FIG. 9F. Also, the connection may be made for the shield coatings on the double-side printed circuit boards 71 and 73. The though holes 77 may be filled with an electrically conductive paste not shown instead of the metal plating for connecting between the lands and the patterns. As the two double-side printed circuit boards 71 and 73 have been joined to each other, the band-pass filter is fabricated.

Figure 9G:
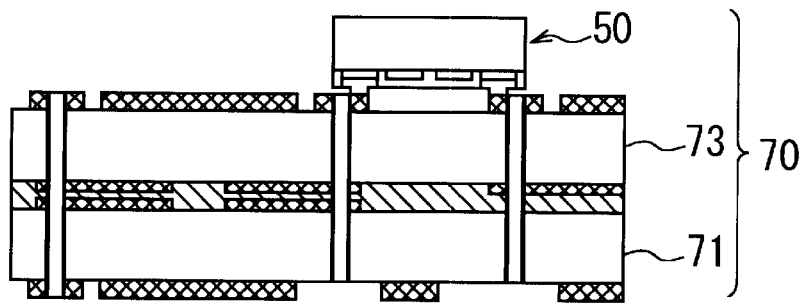

The MMIC 50 is then placed on the lands 75 provided on the shield side of the double-side printed circuit board 73, as shown in FIG. 9G. The bumps 51 of the MMIC 50 are bonded to the lands 75 on the double-side printed circuit board 73 heat pressing with a heat pressing head. As a result, a semiconductor component 70 in which the band-pass filter is connected to the MMIC 50 by minimum lengths is completed similar to that shown in FIGS. 8A to 8F.

The MMIC may be connected to the double-side printed circuit board by providing solder bumps on the MMIC, applying drops of solder to the connecting pads of the double-side printed circuit board, and heating to solder between the MMIC and the double-side printed circuit board. Alternatively, the MMIC may be joined to the double-side printed circuit board by a wire-bonding technique or any other appropriate manner.

According to the above method, the semiconductor component is fabricated having the semiconductor device mounted on the shield side of any of the two double-side printed circuit boards joined to each other. The semiconductor device may be sandwiched between the two double-side printed circuit boards for minimizing the signal loss and thus preventing the interference with peripheral circuits.

FIGS. 10A to 10D each illustrates method of fabricating a semiconductor component having a semiconductor device sandwiched between two double-side printed circuit boards which are joined to each other. The semiconductor device such as an MMIC 55 for processing a high-frequency signal is based commonly on a gallium arsenide substrate. The MMIC 55 based on the gallium arsenide substrate can be reduced to a thickness of 20 to 30 $\mu$m by subjecting its back side to a CMP technique, a combination of mechanical polishing and wet etching. Bumps 56 are then provided on the connecting pads of the thinned MMIC 55.

Figure 10A:
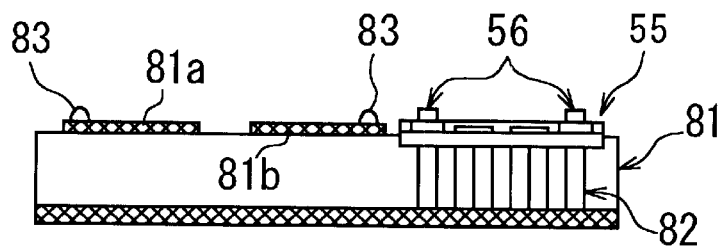
FIGS. 10A to 10D are views showing a method of fabricating a semiconductor component in which the semiconductor device is sandwiched.

The thinned MMIC 55 with the bumps is placed with its face side up at a given location on one double-side printed circuit board 81, as shown in FIG. 10A. If desired, thermal via holes 82 are provided at the location in for dissipation of heat generated at the MMIC 55 or development of ground planes. Also, patterns 81a and 81b incorporating a band-pass filter are provided on the MMIC 55 mounted side of the double-side printed circuit board 81 and then, bumps 83 are provided on the patterns 81a and 81b.

Figure 10B:
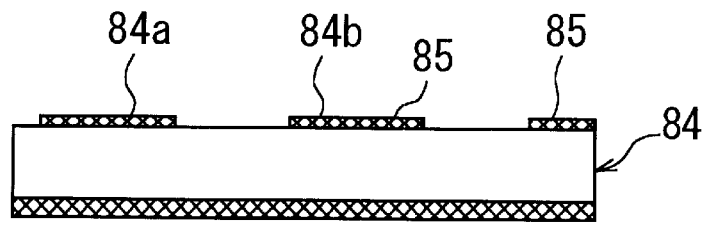

Similarly, as shown in FIG. 10B, patterns 84a and 84b incorporating a band-pass filter and connecting pads 85 for connecting with bumps 56 of the MMIC 55 are provided on one side of another double-side printed circuit board 84 like the double-side printed circuit board 81.

Figure 10C:
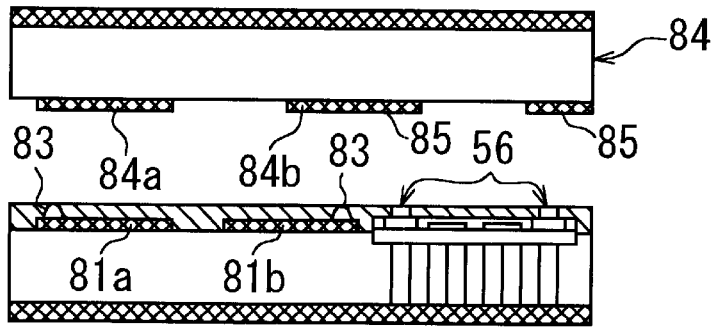

A coating of adhesive 86 is applied to the MMIC 55 mounted side of the double-side printed circuit board 81, as shown in FIG. 10C. The two double-side printed circuit boards 81 and 84 are then placed one over the other so that the patterns 84a and 84b with the connecting pads 85 of the double-side printed circuit board 84 come opposite to the patterns 84a and 84b of the double-side printed circuit board 81.

Figure 10D:
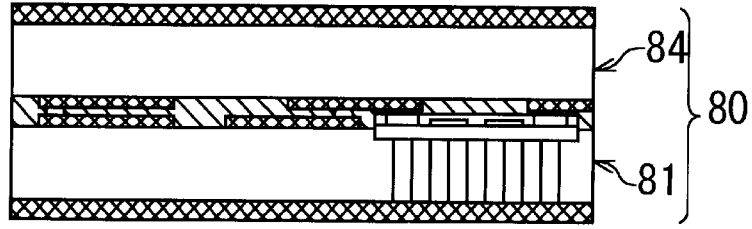

The two double-side printed circuit boards 81 and 84 are heated while being pressed against each other, hence connecting the patterns 81a and 81b to the patterns 84a and 84b, and the bumps 56 of the MMIC 55 to the connecting pads 85 of the double-side printed circuit board 84. As a result, a semiconductor component 80 having the MMIC 55 installed is completed as shown in FIG. 10D.

Figure 11A:
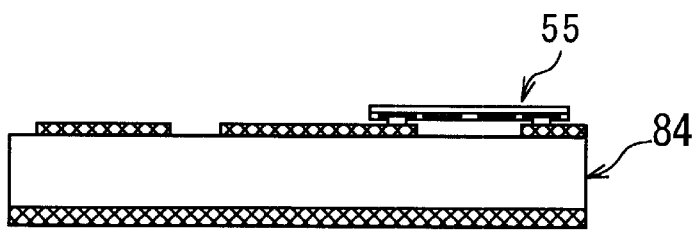
FIGS. 11A to 11C are views showing another method of fabricating the semiconductor component in which the semiconductor device is sandwiched.

According to the method shown in FIGS. 10A to 10D, after the MMIC 55 is placed over the double-side printed circuit board 81, the two double-side printed circuit boards 81 and 84 are joined to each other and the bumps 56 of the MMIC 55 are connected to the connecting pads 85 of the double-side printed circuit board 84. Alternatively, the bumps 56 of the MMIC 55 is first connected to the connecting pads 85 of the double-side printed circuit board 84 and then, the two double-side printed circuit boards 81 and 84 are joined to each other. In the latter case, the MMIC 55 thinned and provided with the bumps 56 is positioned at the specific location with its face side down on the connecting pads 85 of the double-side printed circuit board 84 so that the bumps 56 of the MMIC 55 come just above the connecting pads 85, as shown in FIG. 11A. Then, the bumps 56 are connected to the connecting pads 85 by heat pressing.

Figure 11B:
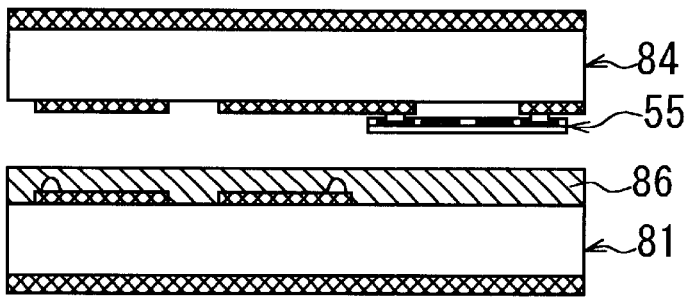

This is followed by placing the double-side printed circuit board 84 with the MMIC 55 mounted over the double-side printed circuit board 81 coated with an adhesive 86 so that their patterns come opposite to each other, as shown in FIG. 11B.

Figure 11C:
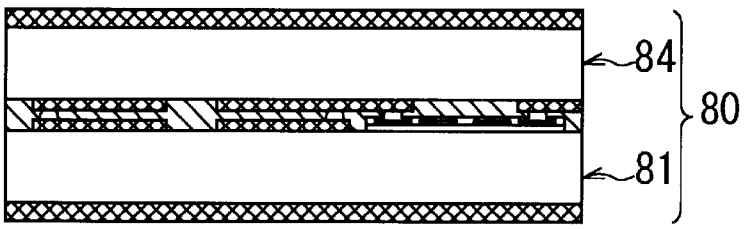

The two double-side printed circuit boards 81 and 84 are heated while being pressed against each other. As a result, a semiconductor component 80 having the MMIC 55 installed is completed as shown in FIG. 11C. The MMIC 55 is not limited to a gallium arsenide substrate but may be based on a silicon substrate or a germanium substrate with equal success.

In case that the semiconductor device is a high electron mobility transistor (HEMT) or a hetero-junction bipolar transistor (HBT) yielded by epitaxial growth of a compound semiconductor, it may be isolated by dissolving the sacrificial layers with acids. The device is then transferred onto the double-side printed circuit board and sandwiched between the two double-side printed circuit boards which are placed one over the other.

FIGS. 12A to 12G each illustrates a further method of fabricating a semiconductor component having a semiconductor device installed therein. According to this method, the semiconductor device is separated from a semiconductor chip, transferred onto one double-side printed circuit board, and sandwiched between the substrates.

Figure 12A:
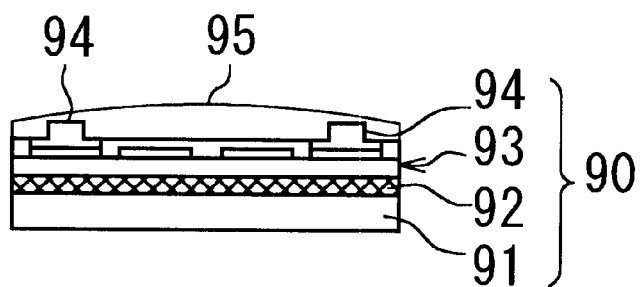
FIGS. 12A to 12G are views showing a method of fabricating a semiconductor component in which the semiconductor device is sandwiched.

As shown in FIG. 12A, an AlAs layer 92 acting as the sacrificial layer is deposited on a compound substrate or GaAs substrate 91 and then, a device 93 including circuit patterns, leads, and bumps is developed on the AlAs layer 92. Also, a way layer 95 is provided over the device 93 for protecting the surface and ease of transferring.

Figure 12B:
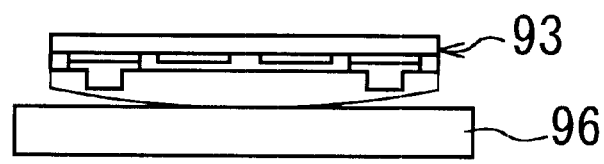

A resultant semiconductor chip 90 is then placed on a primary transfer substrate 96 so that its wax layer 95 comes opposite to the substrate 96, as shown in FIG. 12B, when the semiconductor chip 90 placed on the primary transfer substrate 96 is heated to as a high temperature as 60 to 100° C.

to melt off the wax layer 95 and then cooled down, it is bonded to the primary transfer substrate 96. The AlAs layer 92 is then removed using an acid solution such as diluted HF (hydrofluoric) acid, BHF (buffer hydrofluoric) acid, or HCl. As a result, the device 93 is separated from the GaAs substrate 91 which is then discarded. Accordingly, the device 93 is left on the primary transfer substrate 96.

Figure 12C:
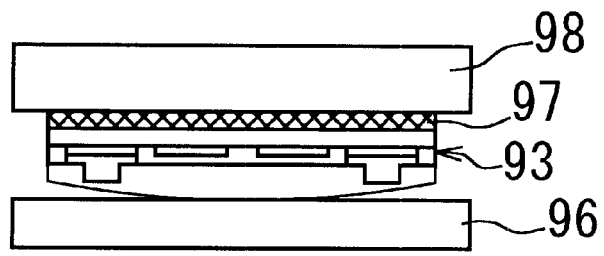
Figure 12D:
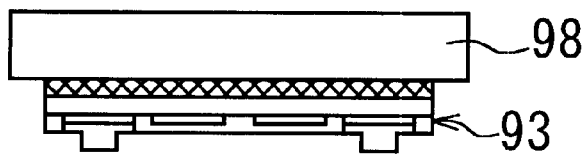

This is followed by bonding the device 93 separated from the GaAs substrate 91 by a thermoplastic adhesive 97 to a secondary transfer substrate 98, as shown in FIG. 12C, and heating the component to melt off the wax layer 95. As a result, the device 93 is successfully separated from the primary transfer substrate 96 as shown in FIG. 12D. Then, the component is rinsed or cleaned so that the bumps 94 of the device 93 can favorably be bonded to the connecting pads 102 on a double-side printed circuit board 101 which will be explained later in more detail.

Figure 12E:
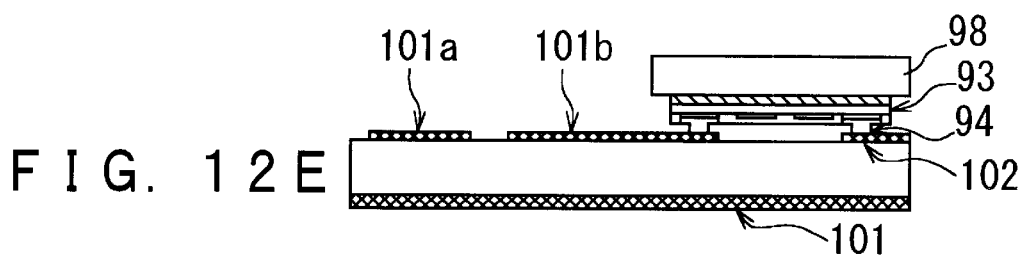

The device 93 bonded to the secondary transfer substrate 98 is positioned over the double-side printed circuit board 101 with its face side down, as shown in FIG. 12E, so that its bumps 94 come opposite to the connecting pads 102 on the double-side printed circuit board 101. The bumps 94 are then bonded to the connecting pads 102 by heat pressing.

Figure 12F:
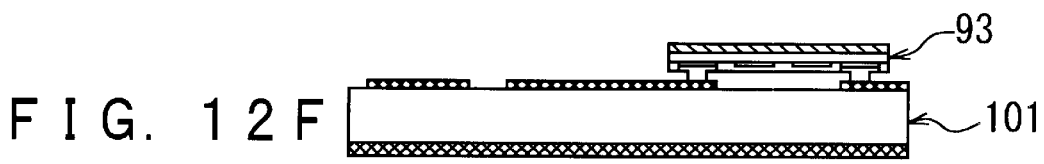

As heated up so as to thermally deform the adhesive 97 by which the device 93 is joined to the secondary transfer substrate 98, the device 93 is separated from the secondary transfer substrate 98 as shown in FIG. 12F.

Figure 12G:
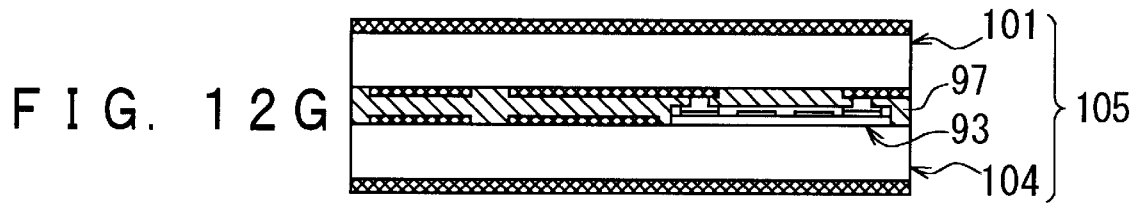

The double-side printed circuit board 101 carrying the device 93 is then placed over one side of another double-side printed circuit board 104 on which a coating of adhesive 97 is applied so that their patterns come opposite to each other. As the two double-side printed circuit boards 101 and 104 are heated while being pressed against each other, they are joined to each other. Accordingly, a semiconductor component 105 having the device 93 installed therein is completed as shown in FIG. 12G.

In case that the device to be transferred is developed on a silicon substrate, the sacrificial layer may be a porous polysilicon layer or an amorphous carbon layer. Also, if the device is deposited on an InP substrate, the sacrificial layer may be an AlInAs layer.

Figure 13:
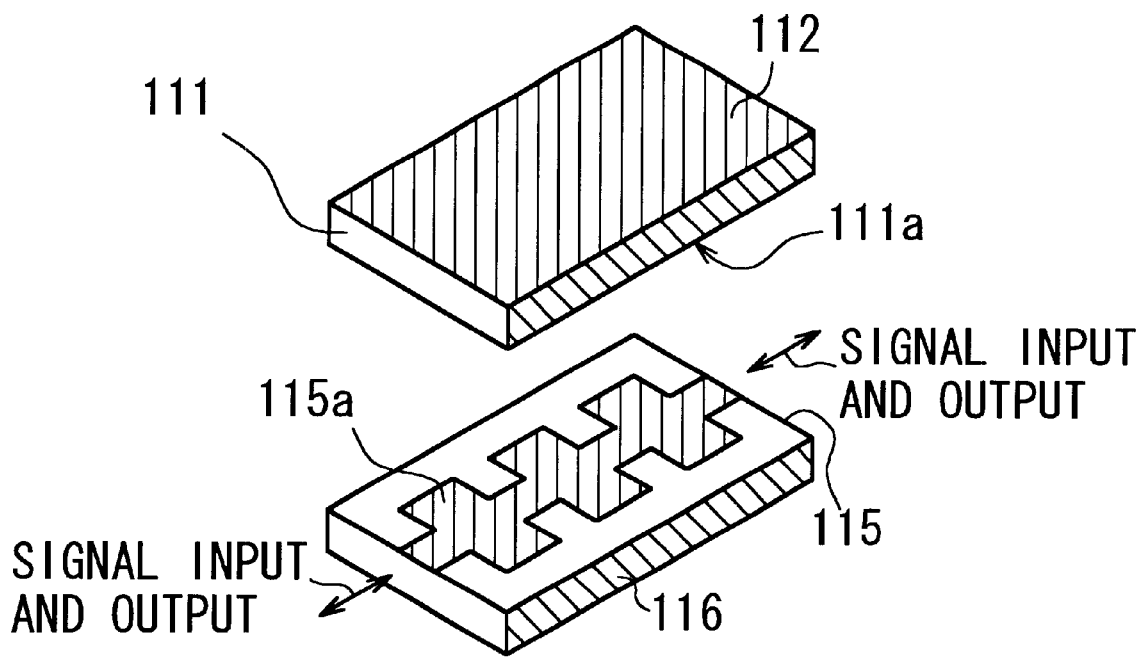
FIG. 13 is a view showing a low-pass filter.

While the embodiments are described in the form of a band-pass filter having the SIR structure, the circuit device is not limited to the band-pass filter but may be a low-pass filter, a high-pass filter, or a connector. For example, such a low-pass filter is shown in FIG. 13. A couple of double-side printed circuit boards 111 and 115 has at one side two patterns 111a and 115b respectively which incorporate the low-pass filter and at the other side two shield coatings 112 and 116 respectively. The two double-side printed circuit boards 111 and 115 are placed one over the other so that the pattern 111a comes opposite to the pattern 115a and joined to each other by an adhesive thus connecting the pattern 111a to the pattern 115a. As a result, the low-pass filter can have a desired level of filtering characteristic without being affected from the adhesive.

In case of a high-pass filter, three double-side printed circuit boards 121, 124, and 127 are used as shown in FIG. 14. Particularly, the two double-side printed circuit boards 121 and 124 have at one side two patterns 121a and 124a which incorporate the high-pass filter. Also, patterns 124b and 127b incorporating the high-pass filter are provided on the other side of the double-side printed circuit board 124 and one side of the double-side printed circuit board 127 respectively. The other sides of the two double-side printed circuit boards 121 and 127 are covered with two shield coatings 122 and 128 respectively. The two double-side printed circuit boards 121 and 124 are placed one over the other so that the pattern 121a comes opposite to the pattern 124a, and joined to each other by an adhesive. Similarly, the two double-side printed circuit boards 124 and 127 are placed one over the other so that the pattern 124a comes opposite to the pattern 127a, and joined to each other by the adhesive. As a result, the patterns 121a and 124a are connected to each other while the patterns 124b and 127b are connected to each other. Accordingly, the high-pass filter can have a desired level of filtering characteristic without being affected from the adhesive.

The circuit device is not limited to a filter serving as a distributed constant circuit but may be a concentrated constant circuit such as a capacitor. In the latter case, the device can be set to a desired level of capacitance regardless of the effect of a bonding material.

According to the present invention, a circuit device board is provided by: joining a first dielectric substrate having a first conductor pattern provided thereon to a second dielectric substrate having a second conductor pattern provided thereon by an adhesive dielectric layer so that the two conductor patterns come opposite to each other; arranging the first conductor pattern to a circuit device pattern shape for performing a desired function while arranging the second conductor pattern to a shape substantially identical to the first conductor pattern so that the two patterns can overlap each other; and providing a grounding conductor on the outer side of each of the first and second dielectric substrates. Hence, when a circuit device such as a band-pass filter is implemented by a combination of the first and second conductor patterns and the grounding conductors, its frequency response can be obtained at a desired level without being affected by the dielectric factor or thickness of the adhesive dielectric layer.

Also, when the conductor patterns are provided in layers, the surface area of its signal lines can be increased thus improving the skin effect at a high freqluency range and minimizing the signal loss. The thickness of the conductor pattern is thinner than that of the grounding conductor, ensuring a higher accuracy in the fabricating the conductor patterns. Moreover, the semiconductor device connected with the first or second conductor pattern is mounted on or between the substrates of circuit device board as connected by minimum lengths to the same, whereby the signal loss derived from extended connecting leads can be avoided and the interference with other circuits can be minimized.

What is claimed is:

1. A circuit device board, comprising:
   a first dielectric substrate having a first conductor pattern provided thereon;
   a second dielectric substrate having a second conductor pattern provided thereon;
   an adhesive dielectric layer positioned between the first dielectric substrate and the second dielectric substrate which joins the first dielectric substrate and the second dielectric substrate to position the first conductor pattern and the second conductor pattern opposite to each other; the first conductor pattern arranged to a circuit device pattern shape for performing a desired function while the second conductor pattern is arranged to a shape substantially identical to the first conductor pattern in order that the first conductor pattern and the second conductor pattern overlap each other; and
   a grounding conductor positioned on an outer side of each of the first dielectric substrate and the second dielectric substrate wherein the thickness of the first conductor pattern and the second conductor pattern is thinner than the grounding conductor.

2. A circuit device board according to claim 1, wherein the first dielectric substrate has at least one layer of a substantially equally shaped conductor pattern provided via an insulating dielectric layer on the first conductor pattern thereof.

3. A circuit device board according to claim 1, wherein each of the first and second dielectric substrates is a double-side printed circuit board of which the other side than the conductor pattern side has a conductive layer provided as the grounding conductor.

4. A circuit device board according to claim 1, wherein the second dielectric substrate has at least one layer of a substantially equally shaped conductor pattern provided via an insulating dielectric layer on the second conductor pattern thereof.

5. A method of making a circuit device board comprising the steps of:
forming a first conductor pattern on one side of a first dielectric substrate, the first dielectric substrate having at least one conductive layer provided on both sides thereof;
forming a second conductor pattern, which is substantially identical in the shape to the first conductor pattern on one side of a second dielectric substrate, the second dielectric substrate having at least one conductive layer provided on both sides thereof; and
bonding the first dielectric substrate and the second dielectric substrate to each other by an adhesive dielectric layer so that the first conductor pattern and the second conductor pattern overlap each other; and
forming a grounding conductor on an outer side of each of the first dielectric substrate and the second dielectric substrate wherein the thickness of the first conductor pattern and the second conductor pattern is thinner than the grounding conductor.

6. A method of making a circuit device according to claim 5, wherein the first dielectric substrate and the second dielectric substrate are bonded to each other after at least one layer of a substantially equally shaped conductor pattern is provided via an insulating dielectric layer on the conductor pattern of the first dielectric substrate.

7. A method of making a circuit device according to claim 5, wherein the first dielectric substrate and the second dielectric substrate are bonded to each other after at least one of a substantially equally shaped conductor pattern is provided via an insulating dielectric layer on the conductor pattern of the second dielectric substrate.

8. A semiconductor component, comprising:
a first dielectric substrate having a first conductor pattern provided thereon;
a second dielectric substrate having a second conductor pattern provided thereon;
an adhesive dielectric layer positioned between the first dielectric substrate and the second dielectric substrate which joins the first dielectric substrate and the second dielectric substrate to position the first conductor pattern and the second conductor pattern opposite to each other, the first conductor pattern arranged to a circuit device pattern shape for performing a desired function while the second conductor pattern is arranged to a shape substantially identical to the first conductor pattern in order that the first conductor pattern and the second conductor pattern overlap each other;
at least one connecting member which connects the first conductor pattern to the second conductor pattern;
a semiconductor device connected to at least one of the first and second conductor patterns; and
a grounding conductor positioned on an outer side of each of the first dielectric substrate and the second dielectric substrate wherein the thickness of the first conductor pattern and the second conductor pattern is thinner than the grounding conductor.

9. A semiconductor component according to claim 8, wherein the first dielectric substrate has at least one layer of a substantially equally shaped conductor pattern provided via an insulating dielectric layer on the first conductor pattern thereof.

10. A semiconductor component according to claim 8, wherein the semiconductor device is sandwiched between the first dielectric substrate and the second dielectric substrate which are bonded to each other.

11. A semiconductor component according to claim 8, wherein the semiconductor device is mounted on the other side that the conductor pattern side of the first or second dielectric substrate.

12. A semiconductor component according to claim 8, wherein the second dielectric substrate has at least one layer of a substantially equally shaped conductor pattern provided via an insulating dielectric layer on the second conductor pattern thereof.

13. A semiconductor component according to claim 8, wherein the at least one connecting member connects the semiconductor to the first conductor pattern.

14. A semiconductor component according to claim 8, wherein the at least one connecting member connects the semiconductor to the second conductor pattern.

15. A method of making a semiconductor component comprising the steps of:
forming a first conductor pattern on one side of a first dielectric substrate, the first dielectric substrate having at least one conductive layer provided on both sides thereof;
forming a second conductor pattern, which is substantially identical in shape to the first conductor pattern, on one side of a second dielectric substrate, the second dielectric substrate having at least one conductive layer provided on both sides thereof;
bonding the first dielectric substrate and the second dielectric substrate to each other by an adhesive dielectric layer so that the first conductor pattern and the second conductor pattern can overlap each other, thus connecting the first conductor pattern and the second conductor pattern to each other and connecting a semiconductor device to at least one of the first and second conductor patterns; and
forming a grounding conductor on an outer side of each of the first dielectric substrate and the second dielectric substrate wherein the thickness of the first conductor pattern and the second conductor pattern is thinner than the grounding conductor.

16. A method of making a semiconductor component according to claim 15, wherein the first dielectric substrate and the second dielectric substrate are bonded to each other after at least one layer of a substantially equally shaped conductor pattern is provided via an insulating dielectric layer on the conductor pattern of the first dielectric substrate.

17. A method of making a semiconductor component according to claim 15, wherein the first or second dielectric substrate has connecting means provided thereon for connecting with the semiconductor device.

18. A method of making a semiconductor component according to claim 15, wherein after the semiconductor device is reduced in thickness and then connected with the first or second conductor pattern, the first dielectric substrate and the second dielectric substrate being bonded to each other.

19. A method of making a semiconductor component according to claim 15, wherein after the semiconductor device is reduced in thickness and then bonded to one of the first and second dielectric substrates, the first dielectric substrate and the second dielectric substrate are bonded to each other so as to connect the semiconductor device with the conductor pattern of the other dielectric substrate.

20. A method of making a semiconductor component according to claim 15, wherein the first dielectric substrate and the second dielectric substrate are bonded to each other after at least one layer of a substantially equally shaped conductor pattern is provided via an insulating dielectric layer on the conductor pattern of the second dielectric substrate.

* * * * *